United States Patent [19]
Crafts et al.

[11] Patent Number: 5,492,235
[45] Date of Patent: Feb. 20, 1996

[54] PROCESS FOR SINGLE MASK C4 SOLDER BUMP FABRICATION

[75] Inventors: Douglas E. Crafts; Venkatesan Murali, both of San Jose, Calif.; Caroline S. Lee, Fresh Meadows, N.Y.

[73] Assignee: Intel Corporation, Santa Clara, Calif.

[21] Appl. No.: 347,873

[22] Filed: Dec. 1, 1994

[51] Int. Cl.⁶ .................................................. H01L 21/92
[52] U.S. Cl. ...................... 216/13; 216/95; 216/100; 216/101; 216/105; 216/106; 216/108; 216/109; 252/79.2; 252/79.3; 437/183; 156/656.1; 156/652.1
[58] Field of Search ................................ 216/13, 95, 100, 216/101, 105, 106, 108, 109; 252/79.1, 79.2, 79.3; 437/183; 156/656.1, 659.11, 652.1

[56] References Cited

U.S. PATENT DOCUMENTS

| | | | |
|---|---|---|---|
| 5,268,072 | 12/1993 | Agarwala et al. | 216/75 X |
| 5,384,283 | 1/1995 | Gegenwarth et al. | 216/13 X |

FOREIGN PATENT DOCUMENTS

| | | | |
|---|---|---|---|
| 140737 | 7/1985 | Japan | 437/183 |
| 183945 | 8/1986 | Japan | 437/183 |
| 29940 | 2/1988 | Japan | 437/183 |
| 12554 | 1/1989 | Japan | 437/183 |
| 283415 | 10/1993 | Japan | 437/183 |

*Primary Examiner*—Thi Dang
*Attorney, Agent, or Firm*—Blakely, Sokoloff, Taylor & Zafman

[57] ABSTRACT

A method for removing Ball Limiting Metallurgy (BLM) layers from the surface of a wafer in the presence of Pb/Sn solder bumps. In one embodiment, the BLM comprises two layers: titanium and copper. After Pb/Sn solder bumps have been formed over the electrical contact pads of the wafer, the BLM copper layer is etched with a $H_2SO_4+H_2O_2+H_2O$ solution. While removing the copper layer, the $H_2SO_4+H_2O_2+H_2O$ etchant also reacts with the Pb/Sn solder bumps to form a thin PbO protective layer over the surface of the bumps. When the copper layer has been etched away, the titanium layer is etched with a $CH_3COOH+NH_4F+H_2O$ solution. The PbO layer formed over the surface of the Pb/Sn solder bumps remain insoluble when exposed to the $CH_3COOH+NH_4F+H_2O$ etchant, thereby preventing the solder bumps from being etched in the presence of the $CH_3COOH+NH_4F+H_2O$ etchant. When the titanium etch is complete, the PbO layer is removed from the surface of the Pb/Sn solder bumps by exposing the bumps to a $HCl+NH_2CSNH_2+NH_4Cl+H_2O$ solution.

28 Claims, 3 Drawing Sheets

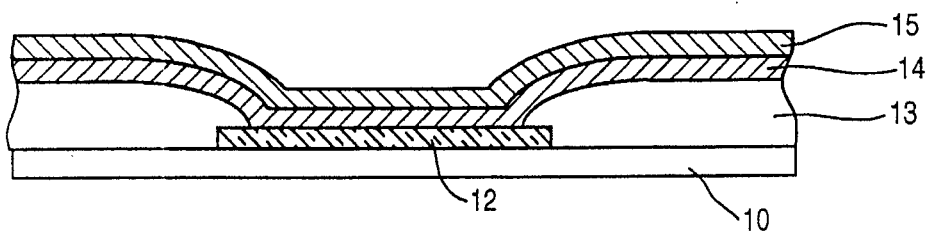
FIG_1
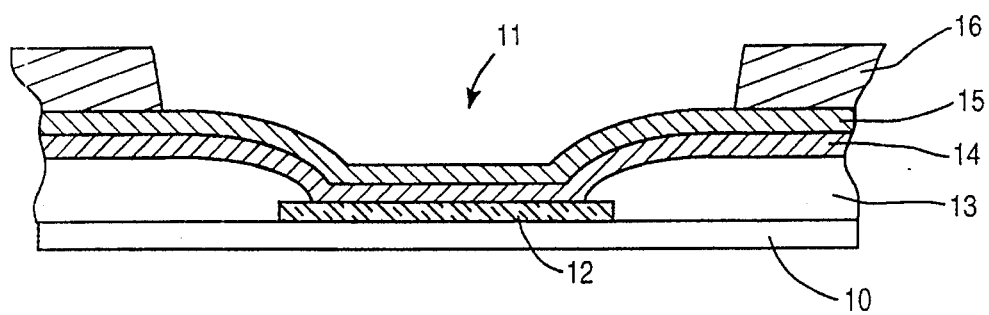
FIG_2
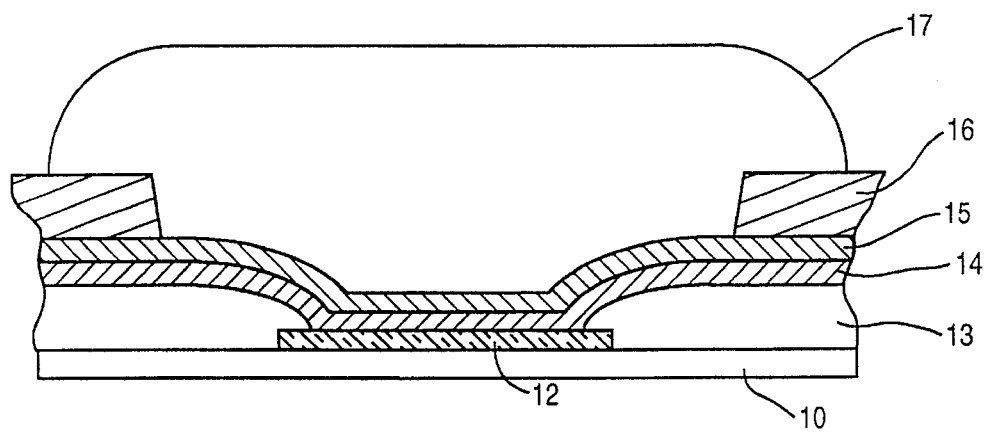
FIG_3

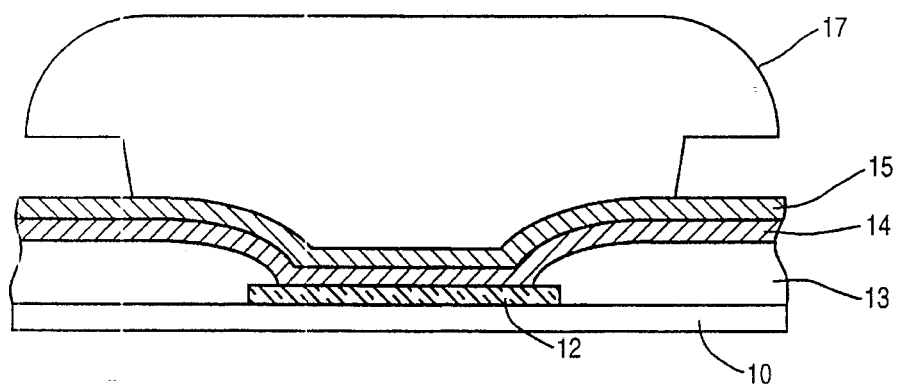
FIG_4
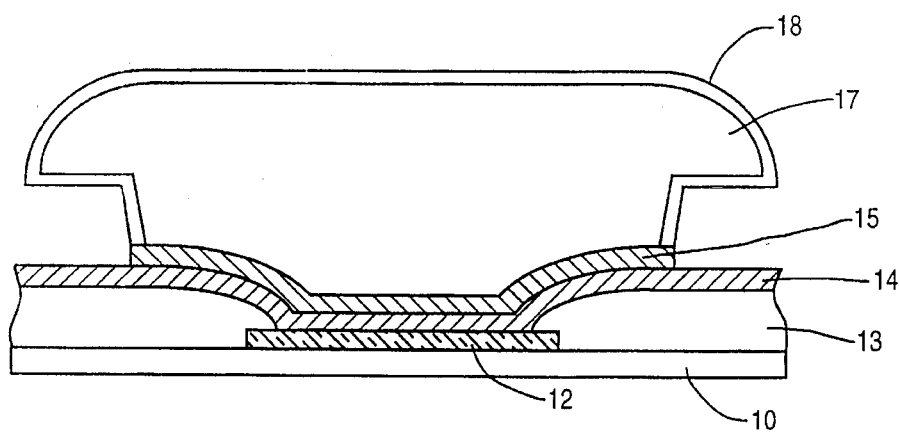
FIG_5
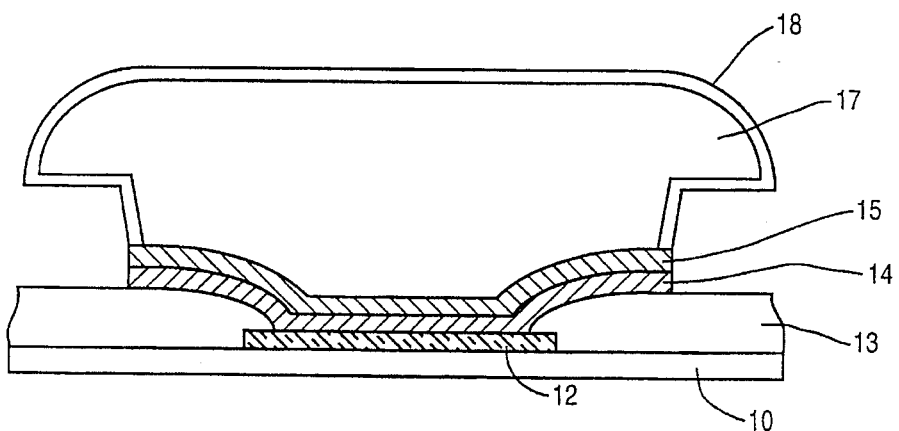
FIG_6

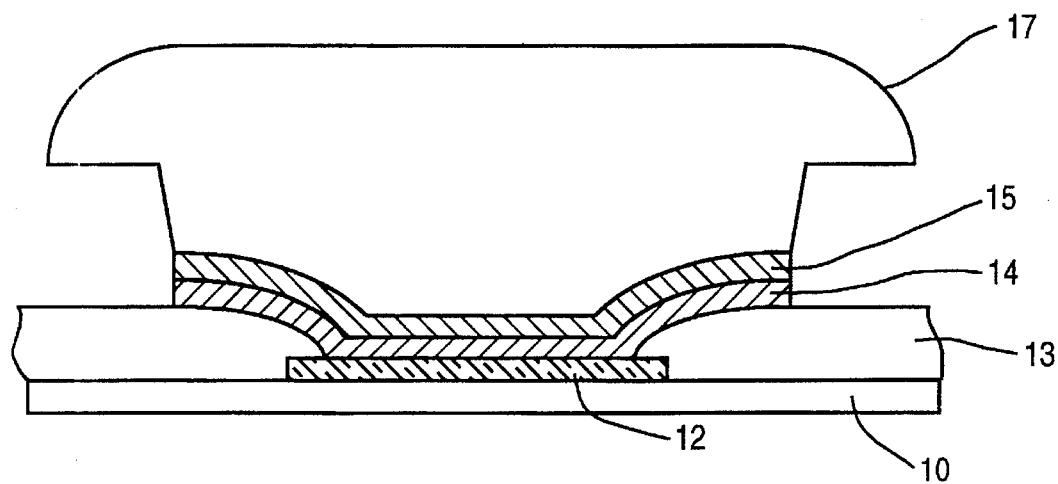
FIG_7
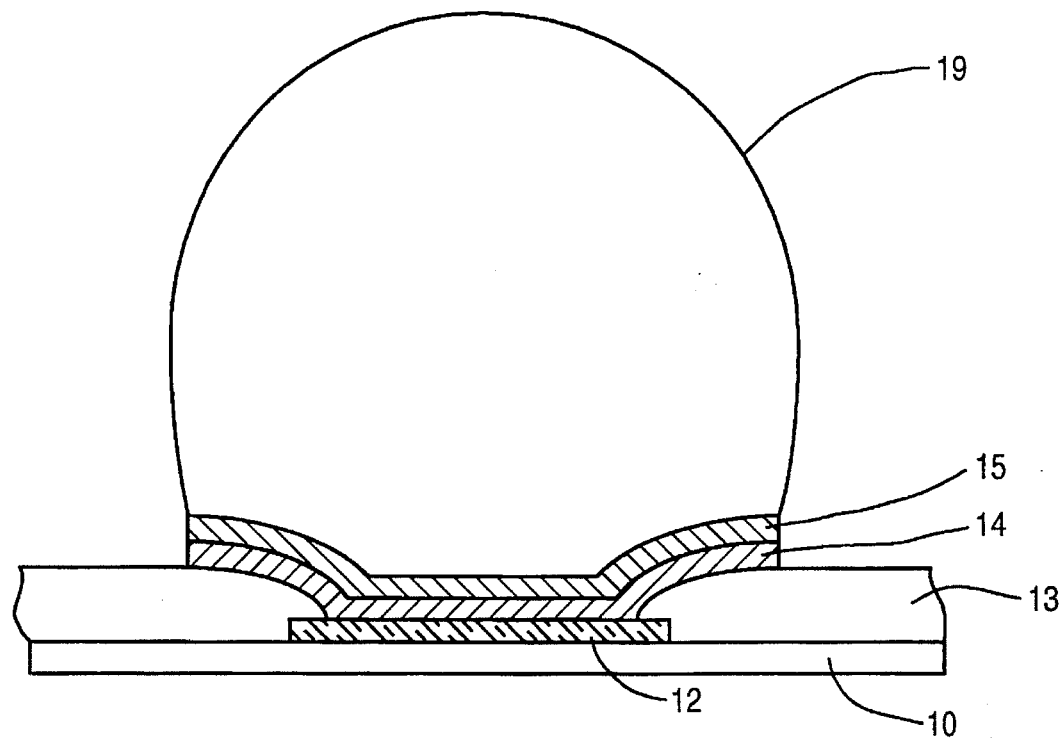
FIG_8

PROCESS FOR SINGLE MASK C4 SOLDER BUMP FABRICATION

FIELD OF THE INVENTION

The present invention relates to the field of semiconductor packaging. More specifically, the invention relates to a process for fabricating Controlled Collapse Chip Connection (C4) Pb/Sn microbumps on the surface of a wafer.

BACKGROUND OF THE INVENTION

With recent advances in silicon technology, microprocessor performance is becoming limited by chip-to-package interconnections. Three primary processes, Wirebonding (WB), Tape Automated Bonding (TAB) and Controlled Collapse Chip Connection (C4), are used to interconnect a chip to a package. The C4 technology offers many advantages over TAB and WB. One advantage is the high input/output density of the C4 process, which enables bumps to be placed anywhere on the chip so that it is easier to make connections to the circuitry at those points. In addition, short solder bumps improve the overall electrical performance and allow more control over the size of the chip. Moreover, the higher density of I/O per chip allows a higher degree of integration at the first packaging level compared with edge-connect packages, such as WB or TAB.

The C4 technology also offers a self-alignment feature whereby the surface tension of the solder allows the solder balls to form self-aligned metallurgical joints with the substrate. This is not possible with WB or TAB.

There are two types of solder bump formation processes used in C4 technology: evaporation and electroplating. C4 technology was originally developed by IBM in the 1960s to resolve problems involving manual wirebonding. The IBM method utilizes an evaporation process in implementing the C4 technology. After passivation patterning, the evaporation process includes the formation of under-bump-metallization (UMB) layers, such as chromium/copper/gold, that are sequentially deposited onto a wafer through the holes of a metal mask using an evaporator. The chromium layer acts as an adhesion promoter and a diffusion barrier metal layer which makes contact with the aluminum-silicon electrical contact pads of the wafer. A layer of copper is then deposited over the chromium layer to promote the eventual wetting of solder onto the electrical contact pads. In order to prevent the copper from oxidizing, a layer of gold is deposited over the copper layer. Finally, Pb/Sn solder is deposited onto the metal coated electrical contact pads through the same mask using another evaporator. The wafer, including solder bumps, is then placed in a hydrogen ambient furnace at 365 degrees Celsius for reflow. During reflow the solder bumps take upon a spherical shape and are wetted onto the electrical contact pads of the wafer. The entire evaporation process is performed in a vacuum.

Although the evaporation process is well established, costs associated with the deposition process are high. Moreover, since the thermal expansion coefficient between the silicon wafer and the metal mask is different, it becomes increasing more difficult to control the dimensional accuracy of the solder bumps as the size of the wafer increases.

An alternate method for depositing solder bumps is electroplating. This process includes the sputter formation of blanket layers or Ball Limiting Metallurgy (BLM) onto the surface of a wafer. Electroplating, in more general terms, is the deposition of a metallic coating onto a conductive object placed in an electrolytic bath. Using the terminal as the anode, a DC current is passed through an electrolytic bath solution effecting a transfer of metal ions onto a cathodic surface. In the case of C4 technology, the BLM represents the cathodic surface of the wafer. Once the BLM is formed, photoresist is applied over the BLM and the resist is patterned to form vias using a photolithography process. The wafer is then subjected to a Pb/Sn electrolytic bath where Pb/Sn bumps are formed in the vias of the patterned resist. After stripping the resist, using the bumps as a mask, the BLM is selectively etched to electrically isolate the bumps from each other. The electroplating method is problematic because the solder is soluble in almost every acid and is vulnerable to the etching solutions of the BLM. Although the eclectroplating process is easier and more economical than the evaporation method, the etching of the BLM, without etching away the solder bumps, has remained a difficult problem in the implementation of the electroplating process.

Current electroplating processes require that a second photoresist mask be formed over the solder bumps to protect them from the BLM etch. This process is not well suited for high volume manufacturing because of increased processing costs and reduced quality due to the complexities of obtaining complete bump coverage by the photoresist mask.

What is needed then is a method which solves the problem associated with etching the BLM in the presence of Pb/Sn bumps. As will be seen, the present invention provides an improved Pb/Sn electroplating process for forming C4 solder bumps wherein the ability to etch the BLM in the presence of Pb/Sn bumps is achieved.

SUMMARY OF THE INVENTION

An Improved method for fabricating Controlled Collapse Chip Connection (C4) Pb/Sn bumps on the surface of a wafer is disclosed.

The improved method for manufacturing C4 solder bumps on the surface of a wafer involves an Pb/Sn electroplating process wherein Pb/Sn solder bumps are formed over the electrical contact pads of the wafer. Since electrolytic plating requires a conductive surface, the surface of the wafer is metallized. The metallization layer is more commonly referred to as Ball Limiting Metallurgy (BLM) and comprises a multiple metal stack. The BLM serves a second purpose by providing the proper metallurgy between the Pb/Sn bumps and the electrical contact pads of the wafer.

In one embodiment of the present invention the BLM includes two layers: titanium and copper. Titanium forms the inner layer of the BLM and covers both the electrical contact pad and passivation layer regions of the wafer. A copper layer is applied over the titanium layer and forms the outer surface of the BLM.

Once the BLM is formed, photoresist is applied over the BLM and the resist is patterned to form vias using a photolithography process. The wafer is then subjected to a Pb/Sn electrolytic bath where Pb/Sn bumps are formed in the vias of the patterned resist. After stripping the resist, the BLM is etched to electrically isolate the Pb/Sn bumps from each other. An etching solution comprising $H_2SO_4+H_2O_2+H_2O$ is used to remove the outer copper layer of the BLM. While removing the copper layer, the $H_2SO_4+H_2O_2+H_2O$ etchant also reacts with the Pb/Sn bumps to form a thin PbO protective layer over the surface of the bumps. When the copper has been etched away, the surface of the wafer is exposed to a $CH_3COOH+NH_4F+H_2O$ etchant which removes any exposed titanium from the surface of the wafer. The PbO layer formed over the surface of the Pb/Sn bumps remains insoluble when exposed to the $CH_3COOH+NH_4F+H_2O$ etchant, thereby preventing the solder bumps from being etched in the presence of the $CH_3COOH+NH_4F+H_2O$ etchant. When the titanium etch is complete, the PbO layer is removed from the surface of the Pb/Sn bumps by exposing the bumps to a $HCl+NH_2CSNH_2+NH_4Cl+H_2O$ solution. The wafer is then run through a reflow furnace where the Pb/Sn bumps take upon a spherical shape. Thus, the present invention provides a Pb/Sn electroplating process for forming C4 solder bumps wherein the ability to etch the BLM in the presence of the Pb/Sn bumps is achieved without the need of an additional masking step.

BRIEF DESCRIPTION OF THE DRAWINGS

The present invention is illustrated by way of example and is not limited by the figures of the accompanying drawings, in which like references indicate similar elements, and in which:

FIG. 1 illustrates a cross-sectional view of one embodiment of the present invention after the metallization of the wafer substrate and electrical contact pad surfaces.

FIG. 2 illustrates a cross-sectional view of the embodiment illustrated in FIG. 1 after the resist has been patterned to form vias.

FIG. 3 illustrates a cross-sectional view of the configuration illustrated in FIG. 2 after Pb/Sn solder bumps are formed in the vias of the patterned resist.

FIG. 4 illustrates a cross-sectional view of the configuration illustrated in FIG. 3 after the resist has been stripped from the wafer substrate surface.

FIG. 5 illustrates a cross-sectional view of the configuration illustrated in FIG. 4 after the BLM outer layer has been etched.

FIG. 6 illustrates a cross-sectional view of the configuration illustrated in FIG. 5 after the BLM inner layer has been etched.

FIG. 7 illustrates a cross-sectional view of the configuration illustrated in FIG. 6 after the protective layer is removed from the Pb/Sn solder bumps.

FIG. 8 illustrates the wafer substrate, electrical contact pad, metal underlay and solder bump configuration illustrated in FIG. 7 after reflow.

DETAILED DESCRIPTION

A method for forming Controlled Collapse Chip Connection (C4) Pb/Sn bumps on the surface of a wafer is described. In the following description, numerous specific details are set forth such as material types, dimensions, processing steps, etc., in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention.

As mentioned earlier, there are two types of solder formation processes used in C4 technology: evaporation and electroplating. The present invention applies particularly to a Pb/Sn electroplating process wherein Pb/Sn solder bumps are formed over the electrical contact pads of a semiconductor substrate. Since electrolytic plating requires a conductive surface to facilitate the transfer of metal ions, the surface of the substrate is metallized. The metallization layer is more commonly referred to as Ball Limiting Metallurgy (BLM) and typically comprises a multiple metal stack. The BLM serves a second purpose by providing the proper metallurgy between the Pb/Sn solder bumps and the electrical contact pads of the substrate.

FIG. 1 illustrates the substrate 10, electrical contact pad 12, passivation layer 13, and BLM layers 14 and 15 of one embodiment of the present invention. Substrate 10 represents the cross-section of a semiconductor device. The substrate contains electrical contact pads 12 that are used to electrically couple the semiconductor device to other external devices. Substrate 10 is made of any temperature resistant, semiconductor material, such as polysilicon, germanium, etc. Electrical contact pad 12 represents a typical electrical contact pad which comprises an electrically conductive material, such as, for example, an aluminum/copper alloy. Passivation layer 13 typically comprises a polyimide layer. It should be understood, however, that any dielectric material that is capable of providing an electrical insulation layer may be used.

As previously discussed, the BLM serves two functions: It provides an electrically conductive surface that facilitates the transfer of metal ions onto the substrate surface during the Pb/Sn solder bump electroplating process and also acts as an adhesion layer between electrical contact pad 12 and the solder bump 17. In one embodiment, as depicted in FIG. 1, the BLM includes two layers: a first layer 14 comprising titanium and a second layer 15 comprising copper. The titanium of the inner layer 14 covers the surfaces of electrical contact pad 12 and passivation layer 13. Titanium is an excellent adhesion metal and adheres well with aluminum contact pad 12 and passivation layer 13. Unfortunately, however, titanium does not bond well with lead. Moreover, titanium does not provide a good diffusion barrier between lead and aluminum. Hence, in the embodiment of FIG. 1, a second layer 15 comprising copper is applied over the titanium layer 14 to form the outer surface of the BLM. Copper is chosen since it adheres well with titanium and lead and, because it acts as a good passivation barrier layer between lead and aluminum. Titanium and copper layers 14 and 15 are formed over the surfaces of substrate 10 and electrical contact pad 12 by means of a physical vapor deposition (PVD) process.

Once layers 14 and 15 are formed, photoresist is applied over the BLM and the resist is pattern to form vias 11 using a photolithography process. (See FIG. 2.) The substrate is then subjected to a Pb/Sn electrolytic bath where Pb/Sn bumps 17 are formed in the vias 11 of the patterned resist 16. (See FIG. 3.)

Once the resist is stripped from the surface of the substrate (see FIG. 4), it is necessary to etch BLM layers 14 and 15 in order to electrically isolate the Pb/Sn bumps 17 from one another. As previously discussed, the etching of the BLM layers, without etching away the Pb/Sn solder bumps, has remained a difficult problem in the implementation of the electroplating process. Current electroplating processes require that a second photoresist mask be formed over the solder bumps to protect them from the BLM etch. This process is not well suited for high volume manufacturing because of increased processing costs and reduced quality due to the complexities of obtaining complete solder bump coverage by the photoresist mask. To reduce manufacturing costs and to increase reliability, the present invention uses a series of process steps that obviate the need to mask the Pb/Sn solder bumps while etching the BLM layers.

The ability to etch BLM layers 14 and 15 in the presence of solder bump 17 is achieved in the present invention by the use of a selected combination of etchants. In order to remove the outer copper layer 15 of the BLM, one embodiment of the present invention uses an etching solution comprising $H_2SO_4+H_2O_2+H_2O$. While removing the exposed portions of copper layer 15, the $H_2SO_4+H_2O_2+H_2O$ etchant also reacts with the Pb/Sn solder bump 17 to form a thin PbO protective layer 18 over the surface of the bump. (See FIG. 5.) The formation of PbO layer 18 is governed by the following equation: $Pb+H_2O_2 \rightarrow PbO+H_2O$. When the copper etch is complete, the substrate surface is exposed to a $CH_3COOH+NH_4F+H_2O$ etchant which removes any exposed portions of titanium layer 14 from the surface of substrate 10. PbO layer 18 remains insoluble when exposed to the $CH_3COOH+NH_4F+H_2O$ etchant, thereby preventing solder bump 17 from being etched in the presence of the $CH_3COOH+N H_4F+H_2O$ etchant. FIG. 6 illustrates a cross-sectional view of the present invention after the BLM etch. As shown in FIG. 6, when the titanium etch is complete, layers 14 and 15 only exist beneath solder bump 17.

Since PbO layer 18 greatly diminishes the solderability of solder bump 17, the layer should be removed prior to reflow. Therefore, when the titanium etch is complete, PbO layer 18 is removed from the surface of Pb/Sn bumps 17 by exposing the bump to a $HCl+NH_2CSNH_2+NH_4Cl+H_2O$ solution. FIG. 7 illustrates a cross-sectional view of the present invention after PbO layer 18 has been removed. Once PbO layer 18 is removed, substrate 10 is run through a reflow furnace where Pb/Sn bump 17 takes upon the form of a solder ball 19 as shown in FIG. 8.

In one embodiment of the present invention titanium layer 14 and copper layer 15 have thicknesses of approximately 0.43 and 0.05 microns, respectively. Solder bump 18 typically comprises a 97/3 Pb/Sn composition having a melting temperature of approximately 315 degrees Celsius. It should be understood, however, that any Pb/Sn composition that is resistant to melting during the electroplating and etching process steps may be used. In an embodiment comprising solder bumps having a 97/3 Pb/Sn composition the reflow furnace temperature is set at approximately 325 degrees Celsius, plus or minus 5 degrees. Once the electroplating process is complete solder bump 17 has a thickness and diameter of approximately 63 and 200 microns, respectively. After reflow, solder ball 19 has a diameter of approximately 125 microns.

In one embodiment of the present invention the $H_2SO_4+H_2O_2+H_2O$ etchant solution contains eight parts $H_2O$, six parts $H_2SO_4$, and one part $H_2O_2$. Given this $H_2SO_4+H_2O_2+H_2O$ etchant concentration the time required to etch copper layer 15 and to form PbO layer 17 is approximately three minutes. The titanium etch includes a $CH_3COOH+NH_4F+H_2O$ etchant solution comprising one part $CH_3COOH$, one part $NH_4F$, and 18 parts $H_2O$. Given a titanium layer 14 having a thickness of 0.43 microns, an etch time of approximately two minutes is required. The final PbO etch includes a $HCl+NH_2CSNH_2+NH_4Cl+H_2O$ solution containing twenty five parts HCl, three parts $NH_2CSNH_2$, twenty five parts $NH_4Cl$, and forty seven parts $H_2O$ and requires an etch time of approximately one minutes at room temperature to remove PbO layer 18. It is appreciated that the etchant concentrations and etch times can be varied to obtain substantially the same results.

A second embodiment of the present invention includes a first layer 14 comprising titanium and a second layer 15 comprising nickel. The outer nickel layer is removed with an etching solution comprising $H_2SO_4+H_2O_2+H_2O$. While removing the exposed portions of the nickel layer 15, the $H_2SO_4+H_2O_2+H_2O$ etchant reacts with the Pb/Sn solder bump 17 to form a PbO layer in the manner previously described. When the nickel etch is complete, the exposed portions of the titanium layer 14 are removed using a $HF+H_2O$ etchant. PbO layer 18 remains insoluble when exposed to the $HF+H_2O$ etchant, thereby preventing solder bump 17 from being etched in the presence of the $HF+H_2O$ etchant. PbO layer 18 is removed from the surface of Pb/Sn bump 17 by exposing the bump to a $HCH_3SO_3$ (MSA) solution. The removal of PbO layer 18 from the surface of solder bump 17 is governed by the following equation: $PbO+2CH_3SO_3H \rightarrow Pb(CH_3SO_3)_2+H_2O$.

In the second embodiment of the present invention the $H_2SO_4+H_2O_2+H_2O$ etchant solution contains eight parts $H_2O$, six parts $H_2S)_4$, and one part $H_2O_2$. Given this $H_2SO_4+H_2O_2+H_2O$ etchant concentration the time required to etch nickel layer 15 and to form PbO layer 17 is approximately five minutes. The titanium etch includes a $HF+H_2O$ etchant solution comprising one part HF to two hundred parts $H_2O$. Given a titanium layer 14 having a thickness of 0.43 microns, an etch time of approximately two minutes is required. The final MSA etch includes a $2HCH_3SO_3+H_2O$ solution containing one part $2HCH_3SO_3$ to five parts $H_2O$ and requires an etch time of approximately three minutes to remove PbO layer 18. It is appreciated that the etchant concentrations and etch times can be varied to obtain substantially the same results.

In the foregoing description an embodiment of the present invention is disclosed having BLM layer 14 comprising titanium and BLM layer 15 comprising either copper or nickel. It should be understood, however, that a BLM metal stack comprising titanium and copper, or titanium and nickel, is not essential to the implementation of the present invention, nor is the invention limited to a BLM having only two metal layers. The implementation of the present invention requires only the use of an outer BLM layer etchant that is capable of forming a protective layer over the surface of solder bump 17 that is either impermeable to any subsequent BLM layer etchants or if the protective layer does etch when exposed to subsequent etchants, it etches at such a rate that no substantial etching of the solder bump occurs during subsequent BLM layer etches. As an example, any metal that bonds well with titanium, that acts as a good diffusion barrier, and is capable of being etched with a solution that concurrently forms a protective layer over solder bumps 17 may be used as layer 15. An alternative embodiment of the present invention may, therefore, include a metal layer 15 comprising platinum or palladium. The use of other metal layer will, of course, require a variation in the etchant concentrations and etching times outlined above.

It is appreciated that the methods of the present invention may be used to form solder connections in other technologies. It is further understood that the relative dimensions, geometric shapes, materials and process parameters set forth within the specification are exemplary of the disclosed embodiments only. Other embodiments mat utilize different dimensions, shapes, materials, etchant concentrations and process settings, etc., to achieve substantially the same results.

What is claimed is:

1. A method of removing metal layers from a surface of a wafer in the presence of a Pb/Sn solder bump, said method comprising the steps of:

a) removing a first metal layer from said surface of said wafer by exposing said wafer to a first etchant wherein said first layer is removed from said surface of said wafer and wherein a protective layer is formed on said Pb/Sn solder bump;

b) removing a second metal layer from said surface of said wafer by exposing said wafer to a second etchant wherein said second metal layer is removed from said surface of said wafer and wherein at least a portion of said protective layer remains on said Pb/Sn solder bump after being exposed to said second etchant;

c) removing said protective layer from said Pb/Sn solder bump by exposing said wafer to a third etchant wherein said protective layer is removed from said Pb/Sn bump.

2. The method according to claim 1 wherein said first metal layer comprises copper.

3. The method according to claim 1 wherein said first metal layer comprises nickel.

4. The method according to claim 1 wherein said first metal layer comprises palladium.

5. The method according to claim 1 wherein said first metal layer comprises platinum.

6. The method according to claim 1 wherein said second metal layer comprises titanium.

7. The method according to claim 1 wherein said first etchant comprises $H_2SO_4+H_2O_2+H_2O$.

8. The method according to claim 1 wherein said second etchant comprises $CH_3COOH+NH_4F+H_2O$.

9. The method according to claim 1 wherein said second etchant comprises $HF+H_2O$.

10. The method according to claim 1 wherein said third etchant comprises $HCl+NH_2CSNH_2+NH_4Cl+H_2O$.

11. The method according to claim 1 wherein said third etchant comprises $2HCH_3SO_3+H_2O$.

12. The method according to claim 1 wherein said Pb/Sn solder bump comprises 97/3 Pb/Sn.

13. The method according to claim 1 wherein said protective layer comprises PbO.

14. A method of removing Ball Limiting Metallurgy layers from a surface of a substrate in the presence of a Pb/Sn bump, said method comprising the steps of:

a) exposing said surface of said substrate and said Pb/Sn bump to a first etchant wherein a first metal layer is removed from said surface of said substrate and wherein a PbO layer is formed over said Pb/Sn bump;

b) exposing said surface of said substrate and said Pb/Sn bump to a second etchant wherein a second metal layer is removed from said surface of said substrate and wherein at least a portion of said PbO layer remains on said Pb/Sn bump after being exposed to said second etchant;

c) exposing said Pb/Sn bump to a third etchant wherein said PbO layer is removed from said Pb/Sn bump.

15. The method according to claim 14 wherein said first metal layer comprises copper.

16. The method according to claim 14 wherein said first metal layer comprises nickel.

17. The method according to claim 14 wherein said first metal layer comprises palladium.

18. The method according to claim 14 wherein said first metal layer comprises platinum.

19. The method according to claim 14 wherein said second metal layer comprises titanium.

20. The method according to claim 14 wherein said first etchant comprises $H_2SO_4+H_2O_2+H_2O$.

21. The method according to claim 14 wherein said second etchant comprises $CH_3COOH+NH_4F+H_2O$.

22. The method according to claim 14 wherein said second etchant comprises $HF+H_2O$.

23. The method according to claim 14 wherein said third etchant comprises $HCl+NH_2CSNH_2+NH_4Cl+H_2O$.

24. The method according to claim 14 wherein said third etchant comprises $2HCH_3SO_3+H_2O$.

25. The method according to claim 14 wherein said Pb/Sn solder bump comprises 97/3 Pb/Sn.

26. A method of removing Ball Limiting Metallurgy layers from a surface of a substrate in the presence of a Pb/Sn bump, said method comprising the steps of:

a) exposing said substrate and said Pb/Sn bump to a $H_2SO_4+H_2O_2+H_2O$ etchant wherein a copper layer is removed from said surface of said substrate and wherein a PbO layer is formed over said Pb/Sn bump;

b) exposing said substrate and said Pb/Sn bump to a $CH_3COOH+NH_4F+H_2O$ etchant wherein a titanium layer is removed from said surface of said substrate and wherein said at least a portion of said PbO layer remains on said Pb/Sn bump after being exposed to said $CH_3COOH+NH_4F+H_2O$ etchant;

c) exposing said Pb/Sn bump to a $HCl+NH_2CSNH_2+NH_4Cl+H_2O$ solution wherein said PbO layer is removed from said Pb/Sn bump.

27. A method of removing Ball Limiting Metallurgy layers from a surface of a substrate in the presence of a Pb/Sn bump, said method comprising the steps of:

a) exposing said substrate and said Pb/Sn bump to a $H_2SO_4+H_2O_2+H_2O$ etchant wherein a nickel layer is removed from said surface of said substrate and wherein a PbO layer is formed over said Pb/Sn bump;

b) exposing said substrate and said Pb/Sn bump to a $HF+H_2O$ etchant wherein a titanium layer is removed from said surface of said substrate and wherein said at least a portion of said PbO layer remains on said Pb/Sn bump after being exposed to said $HF+H_2O$ etchant;

c) exposing said Pb/Sn bump to a $2HCH_3SO_3+H_2O$ solution wherein said PbO layer is removed from said Pb/Sn bump.

28. A method of removing Ball Limiting Metallurgy layers from a surface of a substrate in the presence of a Pb/Sn bump, said method comprising the steps of:

a) exposing said surface of said substrate and said Pb/Sn bump to a first etchant wherein a first metal layer is removed from said surface of said substrate and wherein a protective layer is formed over said Pb/Sn bump;

b) exposing said surface of said substrate and said Pb/Sn bump to a second etchant wherein a second metal layer is removed from said surface of said substrate and wherein said protective layer is removed from said Pb/Sn bumps such that no substantial etching of said Pb/Sn bump occurs.

* * * * *